(12) United States Patent
Tsai et al.

(10) Patent No.: US 6,391,682 B1
(45) Date of Patent: May 21, 2002

(54) METHOD OF PERFORMING FLIP-CHIP UNDERFILL IN A WIRE-BONDED CHIP-ON-CHIP BALL-GRID ARRAY INTEGRATED CIRCUIT PACKAGE MODULE

(75) Inventors: Ying-Chou Tsai, Hsin chu; Shih-Kuang Chiu, Taichung, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/598,190

(22) Filed: Jun. 21, 2000

(51) Int. Cl.$^7$ .......................... H01L 21/44; H01L 21/48
(52) U.S. Cl. ...................... 438/108; 438/112; 438/119; 438/124; 438/51; 438/612
(58) Field of Search ................. 438/108, 112, 438/124, 126, 127, 119, 51, 117, 120, 118, 612, 122

(56) References Cited

U.S. PATENT DOCUMENTS

| | | | |
|---|---|---|---|
| 5,120,678 A | * 6/1992 | Moore et al. ................. | 29/840 |
| 5,923,090 A | 7/1999 | Fallon et al. | |
| 5,942,798 A | * 8/1999 | Chiu .......................... | 257/737 |
| 5,981,312 A | * 11/1999 | Farquhar et al. ............ | 438/112 |
| 6,048,656 A | * 4/2000 | Akram et al. ................ | 438/119 |
| 6,153,930 A | * 11/2000 | Hori ............................. | 257/687 |

\* cited by examiner

*Primary Examiner*—Matthew Smith
*Assistant Examiner*—Igwe U. Anya
(74) *Attorney, Agent, or Firm*—Peter F. Corless; Steven M. Jensen; Edwards & Angell, LLP

(57) ABSTRACT

An underfill method is proposed for performing flip-chip underfill in an integrated circuit package of the type based on a WBCOCBGA (Wire-Bonded Chip-On-Chip Ball-Grid Array) construction which includes two semiconductor chips arranged in a chip-on-chip (COC) manner, wherein the underlying chip is electrically coupled to the substrate by means of wire bonding (WB), while the overlying chip is mounted in a flip-chip manner over the underlying chip and electrically coupled to the same by means of ball grid array (BGA) technology. The proposed method is characterized in the forming of an elongated dam structure over a preserved side surface area of the underlying chip beside the bonding wires connected to the underlying chip. During the dispensing process, the dispensed resin can fill into the gap under the overlying chip through capillary action while being prevented from coming in touch with the nearby bonding wires by the dam structure. As a result, the dispensed resin is prevented from flowing to the bottomside of the underlying chip, allowing the finished product of the WBCOCBGA-based package module to be more assured in quality and reliability than the prior art.

13 Claims, 4 Drawing Sheets

METHOD OF PERFORMING FLIP-CHIP UNDERFILL IN A WIRE-BONDED CHIP-ON-CHIP BALL-GRID ARRAY INTEGRATED CIRCUIT PACKAGE MODULE

BACKGROUND OF THE INVENTION

1. Field of the Invention

This invention relates to integrated circuit packaging technology, and more particularly, to a method of performing flip-chip underfill in an integrated circuit package of the type based on a WBCOCBGA (Wire-Bonded Chip-On-Chip Ball-Grid Array) construction.

2. Description of Related Art

The WBCOCBGA package construction is a new kind of integrated circuit packaging technology that includes two semiconductor chips arranged in a chip-on-chip (COC) manner, wherein the underlying chip is electrically coupled to the substrate by means of wire bonding (WB), while the overlying chip is mounted in a flip-chip manner over the underlying chip and electrically coupled to the same by means of ball-grid array (BGA) technology. After the overlying chip is readily mounted over the underlying chip, however, a gap would be undesirably left therebetween, which, if not underfilled, would easily cause the two chips to suffer from fatigue cracking and electrical failure when the entire package structure is being subjected to high-temperature conditions. As a solution to this problem, it is an essential step in the fabrication of a WBCOCBGA-based package module to fill an underfill material, such as resin, into such a gap, so as to provide mechanical reinforcement to the two chips. The involved fabrication process is customarily referred to as flip-chip underfill.

Conventional flip-chip underfill technology, however, would easily allow the dispensed underfill material to be absorbed by nearby bonding wires and thus flashed to other parts of the package structure. This problem is illustratively depicted in the following with reference to FIGS. 1A–1C.

FIG. 1A is a schematic sectional diagram of a typical WBCOCBGA-based package module. As shown, the WBCOCBGA-based package module includes a substrate 10 on which two semiconductor chips (a first semiconductor chip 21 and a second semiconductor chip 22) are mounted in a chip-on-chip manner. The first chip 21 is mounted over the substrate 10 and electrically coupled to the same by means of a set of bonding wires 30, while the second chip 22 is mounted by means of a plurality of solder balls 40 in a flip-chip manner over the first chip 21. After the second chip 22, is readily mounted over the first chip 21, however, a gap 50 would be undesirably left therebetween due to the existence of the solder balls 40. This gap 50, if not underfilled, would easily cause the two chips 21, 22 to suffer from fatigue cracking and electrical failure when the entire package structure is being subjected to high-temperature conditions.

Referring next to FIG. 1B, as a solution to the foregoing problem, a dispensing needle 60 is used to dispense a mass of resin 61 onto a blank side surface area 21a of the first chip 21 beside the second chip 22. The dispensed resin 61 will then fill into the gap 50 through capillary action until substantially filling up the entire gap 50.

One drawback to the forgoing underfill process, however, is that the dispensed resin 61 would easily flow wayward to the nearby bonding wires 30 and subsequently down along the sidewall of the first chip 21 to the top surface of the substrate 10 (the flashed part of the dispensed resin is indicated by the reference numeral 62 in FIG. 1B). This would result in the waste of the dispensed resin and degradation to the quality and reliability of the finished product of the WBCOCBGA-based package module. This drawback is due to the reason that the side surface area 21a between the second chip 22 and the bonding wires 30 is too small in width, typically only from 200 µm to 500 µm (micrometer), and the pitch D of the bonding wires 30, as seen from the top view of FIG. 1C, is typically from 60 µm to 80 µm, so that the dispensed resin 61 thereon would easily come into touch with the nearby bonding wires 30 and absorbed by the same.

Related patents include, for example, the U.S. Pat. No. 5,120,678 entitled "ELECTRICAL COMPONENT PACKAGE COMPRISING POLYMER-REINFORCED SOLDER BUMP INTERCONNECTION" and the U.S. Pat. No. 5,923,090 entitled "MICROELECTRONIC PACKAGE AND FABRICATION THEREOF", to name just a few.

The U.S. Pat. No. 5,120,678 teaches the use of a polymer-formed dam structure to allow the dispensed underfill material to be confined within a specific area. However, this patented method is not intended for use on a WBCOCBGA-based package module. The U.S. Pat. No. 5,923,090 discloses an advanced WBCOCBGA package structure, but teaches nothing about how to prevent the dispensed underfill material from flashing to other parts of the package structure.

Therefore, there still exists a need in the semiconductor industry for an improved underfill method that can help prevent the dispensed underfill material from flashing to other parts of the package structure.

SUMMARY OF THE INVENTION

It is therefore an objective of this invention to provide a method for performing flip-chip underfill in a WBCOCBGA-based package module, which can allow the dispensed underfill material to be confined within the target area.

It is another objective of this invention to provide a method for performing flip-chip underfill in a WBCOCBGA-based package module, which can prevent the dispensed underfill material from flashing to other parts of the package structure.

It is still another objective of this invention to provide a method for performing flip-chip underfill in a WBCOCBGA-based package module, which allows the finished product of the WBCOCBGA-based package module to be more assured in quality and reliability.

In accordance with the foregoing and other objectives, the invention proposes a new method for performing flip-chip underfill in a WBCOCBGA-based package module. The method of the invention is specifically designed for underfilling a gap under a semiconductor chip in a WBCOCBGA-based package module. The method of the invention is characterized in the steps of preserving a predetermined width of surface area beside one side of the overlying semiconductor chip in the COC configuration; and then forming a dam structure over the preserved surface area. A dispensing needle is then used to dispense an underfill material, such as resin, over the area between the dam structure and the overlying semiconductor chip. The dispensed resin can subsequently filling into the gap under the second semiconductor chip through capillary action, while being prevented from coming in touch with the bonding wires by the dam structure. Since no resin would flow to the bottomside of the underlying chip in the COC configuration, the invention allows the finished product of the WBCOCBGA-based package module to be more assured in quality and reliability than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, two preferred embodiments are disclosed in full details in the following with the accompanying drawings.

First Preferred Embodiment (FIGS. 2A–2D and FIG. 3)

Figure 1A:
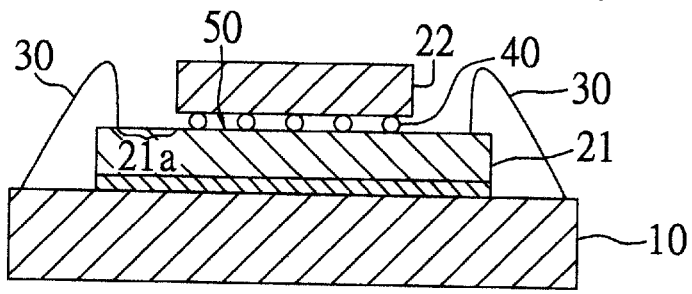
FIGS. 1A–1C (PRIOR ART) are schematic diagrams used to depict the drawback of a conventional underfill method for a WBCOCBGA-based package module.
Figure 1B:
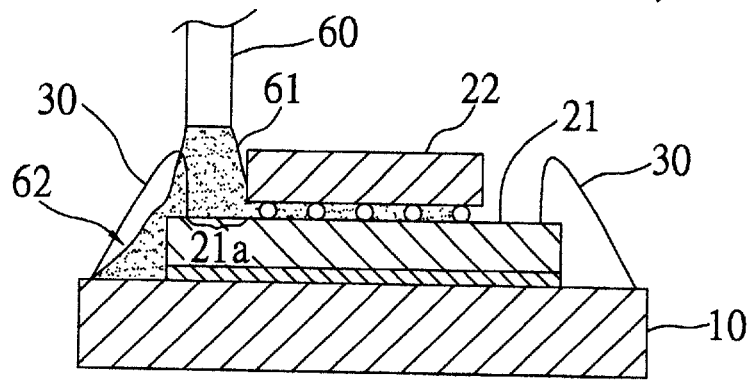
Figure 1C:
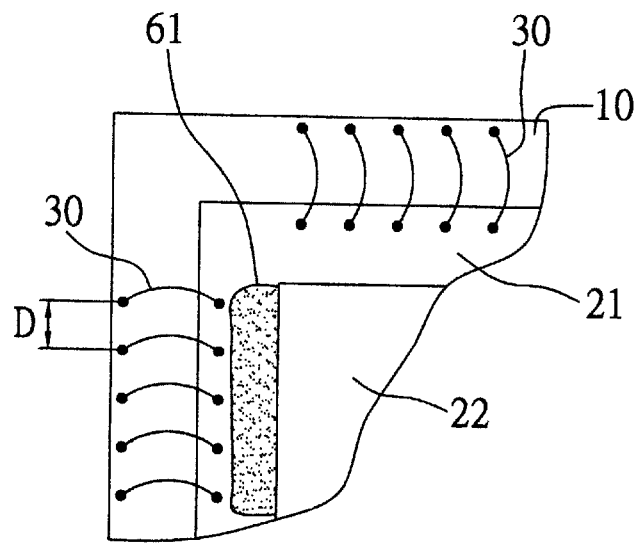
Figure 2A:
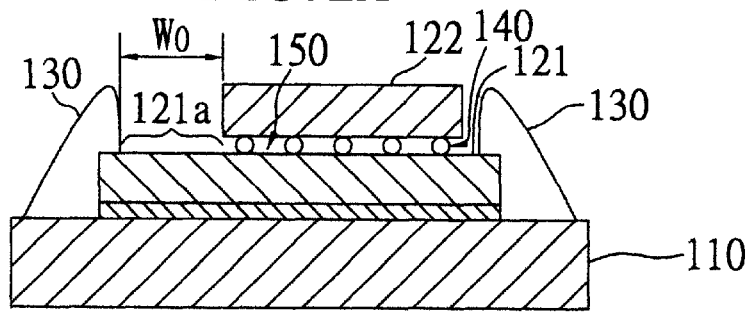
FIGS. 2A–2D are schematic sectional diagrams used to depict a first preferred embodiment of the method of the invention.
Figure 2B:
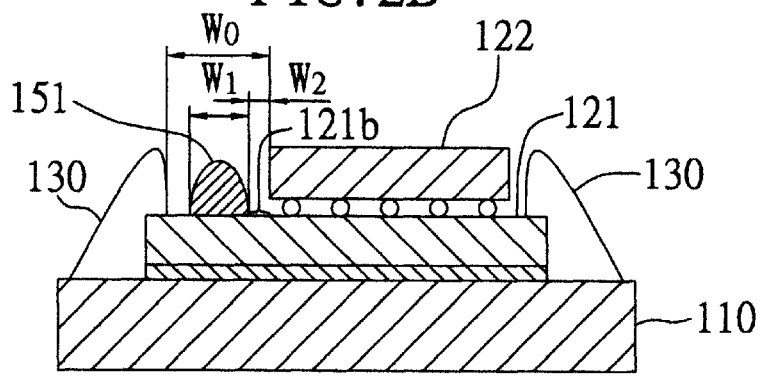
Figure 2C:
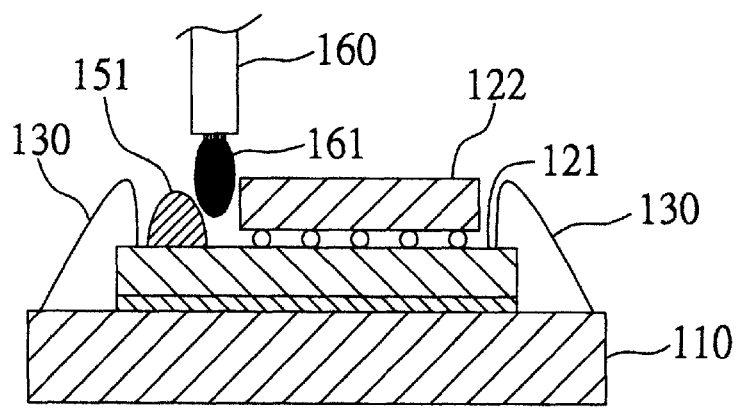
Figure 2D:
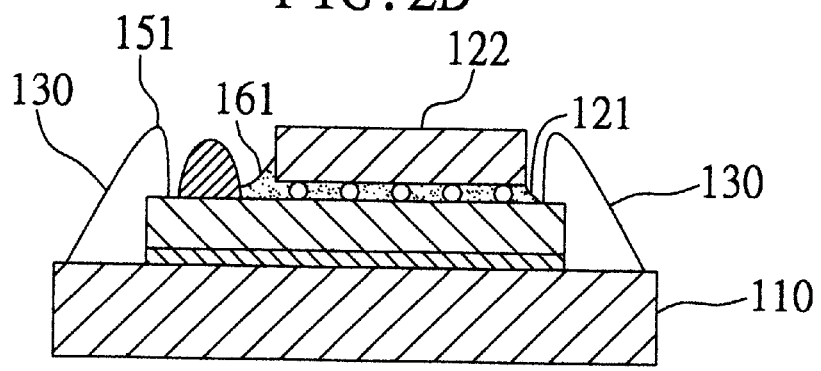
Figure 3:
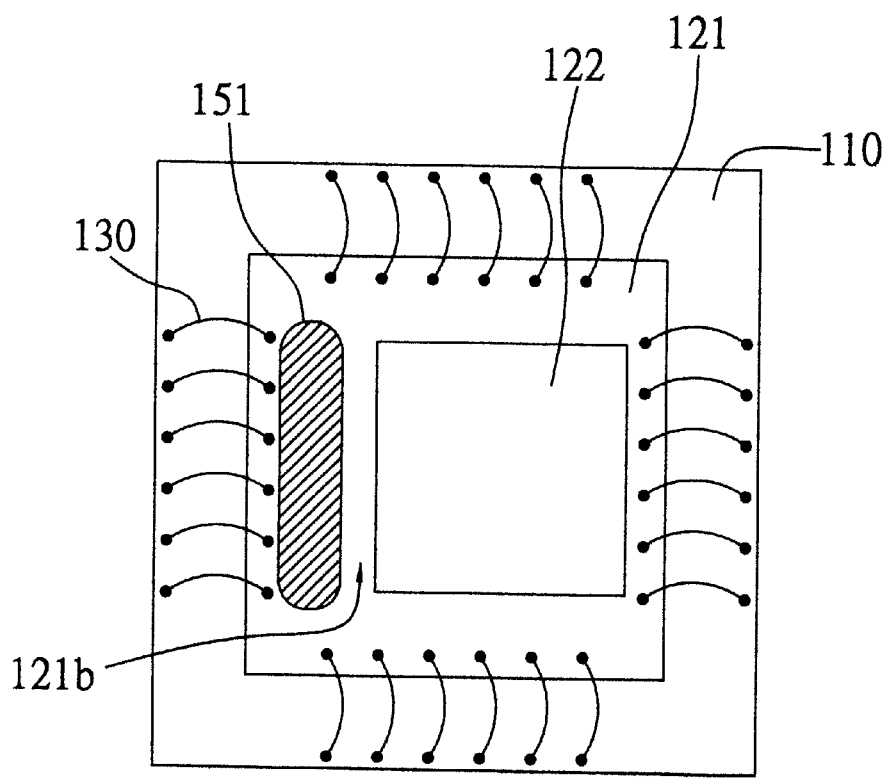
FIG. 3 shows a schematic top view of the package structure shown in FIG. 2B.

The first preferred embodiment of the underfill method of the invention for WBCOCBGA-based package construction is disclosed in full details in the following with reference to FIGS. 2A–2D and FIG. 3; wherein FIGS. 2A–2D are schematic sectional diagrams used to depict the procedural steps involved in a fabrication process for a WBCOCBGA-based package module in which the invention is utilized for flip-chip underfill; while FIG. 3 shows a schematic top view of the semi-finished package module shown in FIG. 2B.

Referring to FIG. 2A, in the WBCOCBGA fabrication process, the first step is to prepare a substrate 110 on which a chip-on-chip (COC) structure is to be constructed. The COC structure includes a first semiconductor chip 121 and a second semiconductor chip 122, wherein the second chip 122 is stacked in a flip-chip manner over the first chip 121 and electrically coupled to the same through a plurality of solder balls 140. After this, a die-bonding process is performed to mount the entire COC structure (i.e., the first chip 121 together with the second chip 122) over the substrate 110; and subsequently, a wire-bonding process is performed to electrically couple the first chip 121 through a set of bonding wires 130 to the substrate 110.

In accordance with the invention, the second chip 122 is dimensioned and positioned over the first chip 121 in such a manner as to preserve a side surface area 121a of the first chip 121 with a predetermined width $W_0$. In practice, for example, the predetermined width $W_0$ is 1 mm (millimeter) for the type of the package module being fabricated.

As mentioned in the background section of this specification, after the second chip 122 is readily mounted over the first chip 121, a gap 150 would be undesirably left therebeween.

Referring further to FIG. 2B together with FIG. 3, in the next step, an elongated dam structure 151 is formed over the preserved side surface area 121a of the first chip 121, preferably through the dispensing of polymer over the side surface area 121a. In practice, for example, this dam structure 151 is preferably formed to a width $W_1$=0.5 mm and separated by a distance $W_2$=0.25 mm from the nearby side of the second chip 122. As a result, a blank area 121b of 0.25 mm in width is left between the dam structure 151 and the second chip 122, which is defined as the dispensing target area. Since polymer has low flowability, it can retain position after being dispensed without being absorbed by the nearby bonding wires 130.

Referring further to FIG. 2C, in the next step, a dispensing needle 160 having a bore diameter substantially equal to the width $W_2$ of the dispensing target area 121b, i.e., 0.25 mm in this embodiment, is used to dispense a predetermined amount of underfill material, such as resin 161, directly onto the dispensing target area 121b. The dispensed resin 161 will then fill into the gap 150 under the second chip 122 through capillary action. During this stage, however, thanks to the provision of the elongated dam structure 151 beside the nearby row of the bonding wires 130, the dispensed resin 161 would be prevented from being absorbed by the nearby bonding wires 130. As a result, the dispensed resin 161 would only flow toward the second chip 122 and fill into the gap 150 under the second chip 122 through capillary action.

Referring further to FIG. 2D, after the dispensing process is completed, it can be seen that the dispensed resin 161 would be confined by the dam structure 151 so that it can be prevented from flowing down along the sidewall of the first chip 121 to the top surface of the substrate 10.

Figure 4:
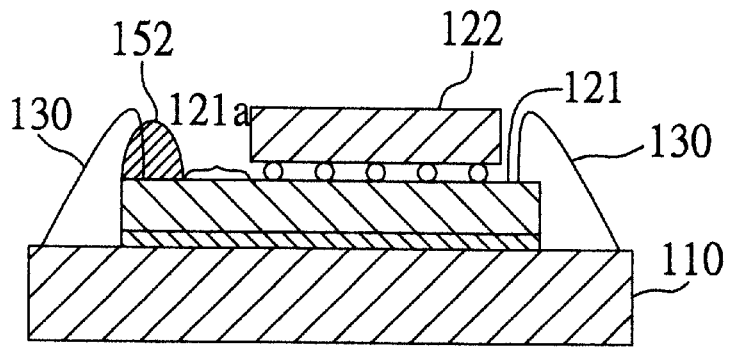
FIG. 4 is a schematic sectional diagram used to depict a second preferred embodiment of the method of the invention.
Figure 5:
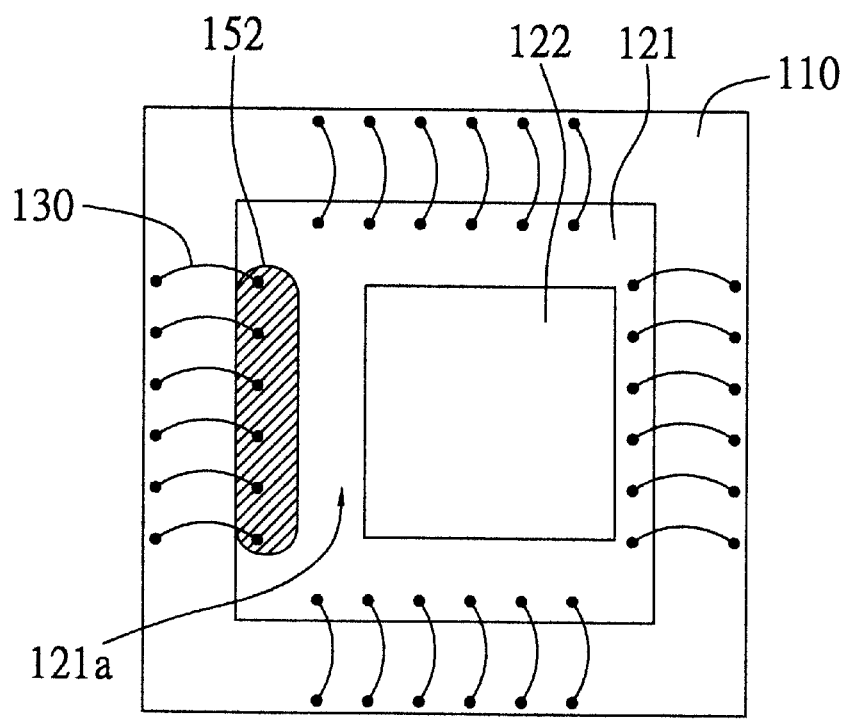
FIG. 5 shows a schematic top view of the package structure shown in FIG. 4.

Second Preferred Embodiment (FIG. 4 and FIG. 5)

The second preferred embodiment of the underfill method of the invention is disclosed in full details in the following with reference to FIGS. 4 and 5. In these drawings, the parts that are identical in structure and purpose as those in the previous embodiment are labeled with the same reference numerals.

As shown, this embodiment differs from the previous one only in that the dam structure, here designated by the reference numeral 152, is formed directly over the bonding points on the first chip 121 where the bonding wires 130 are bonded. This allows the use of the entire preserved side surface area 121a on the first semiconductor chip 121 as the dispensing target area, while preventing the dispensed resin from coming into touch with the nearby bonding wires 130.

CONCLUSION

In conclusion, the method of the invention is characterized in the forming of a dam structure over a preserved side surface area of the underlying chip beside the nearby bonding wires so as to prevent the subsequently dispensed resin from coming in touch with the nearby bonding wires, thus preventing the dispensed resin from flowing to the bottomside of the underlying chip. It is apparent that the method of the invention allows the finished product of the WBCOCBGA-based package module to be more assured in quality and reliability than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for underfilling a gap existing between a first semiconductor chip and a second semiconductor chip mounted in a flip-chip manner over the first semiconductor chip in a WBCOCBGA-based package module;

the method comprising the steps of:

(1) on the front surface of the first semiconductor chip, preserving a predetermined width of surface area beside one side of the second semiconductor chip;

(2) forming a dam structure over the preserved surface area; and (3) dispensing an underfill material over the area between the dam structure and the second semiconductor chip; the dispensed underfill material subsequently filling into the gap under the second semiconductor chip through capillary action.

2. The method of claim 1, wherein in said step (1) the predetermined width of surface area is 1 mm.

3. The method of claim 2, wherein in said step (2) the dam structure is formed to a width of 0.5 mm.

4. The method of claim 3, wherein in said step (3) the dispensing of the underfill material is carried out through a dispensing needle having an outlet of a bore diameter of 0.25 mm.

5. The method of claim 1, wherein in said step (2) the dam structure is formed from polymer.

6. The method of claim 1, wherein in said step (3), the underfill material is resin.

7. A method for fabricating a WBCOCBGA-based package module, comprising the steps of:

(1) preparing a substrate, a first semiconductor chip, and a second semiconductor chip;

(2) mounting the second semiconductor chip over the first semiconductor chip by means of a plurality of solder balls in a flip-chip manner; the second semiconductor chip being dimensioned to a specific size that allows a predetermined width of side surface area to be preserved on the first semiconductor chip; and in which process a gap is undesirably left between the first semiconductor chip and the second semiconductor chip;

(3) performing a die-bonding process to mount the first semiconductor chip together with the second semiconductor chip over the substrate;

(4) performing a wire-bonding process to apply a set of bonding wires for electrically coupling the first semiconductor chip to the substrate;

(5) forming a dam structure over the preserved surface area; and (6) dispensing an underfill material over the area between the dam structure and the second semiconductor chip; the dispensed underfill material subsequently filling into the gap between the first semiconductor chip and the second semiconductor chip through capillary action while being prevented from coming in touch with the bonding wires by the dam structure.

8. The method of claim 7, wherein in said step (4) the predetermined width of surface area is 1 mm.

9. The method of claim 8, wherein in said step (5) the dam structure is formed to a width of 0.5 mm.

10. The method of claim 9, wherein in said step (6) the dispensing of the underfill material is carried out through a dispensing needle having an outlet of a bore diameter of 0.25 mm.

11. The method of claim 7, wherein in said step (5) the dam structure is formed from polymer.

12. The method of claim 7, wherein in said step (5), the dam structure is formed directly over the bonding points on the first semiconductor chip where the bonding wires are bonded to the first semiconductor chip.

13. The method of claim 7, wherein in said step (6), the underfill material is resin.

* * * * *